(12) United States Patent
Boeve

(10) Patent No.: US 7,230,290 B2
(45) Date of Patent: Jun. 12, 2007

(54) DIGITAL MAGNETIC STORAGE CELL DEVICE

(75) Inventor: Hans Boeve, Valkenswaard (NL)

(73) Assignee: Infineon Technologies AG, Neubiberg (DE)

( * ) Notice: Subject to any disclaimer, the term of this patent is extended or adjusted under 35 U.S.C. 154(b) by 301 days.

(21) Appl. No.: 10/479,521

(22) PCT Filed: Jun. 11, 2002

(86) PCT No.: PCT/DE02/02126

§ 371 (c)(1),
(2), (4) Date: Apr. 19, 2004

(87) PCT Pub. No.: WO02/101750

PCT Pub. Date: Dec. 19, 2002

(65) Prior Publication Data

US 2004/0165423 A1    Aug. 26, 2004

(30) Foreign Application Priority Data

Jun. 11, 2001    (DE) ................ 101 28 154

(51) Int. Cl.
*H01L 29/76* (2006.01)
(52) U.S. Cl. ...................... 257/295; 257/421
(58) Field of Classification Search ........ 257/421, 257/295
See application file for complete search history.

(56) References Cited

U.S. PATENT DOCUMENTS

| | | | |
|---|---|---|---|
| 5,385,637 A | 1/1995 | Thayamballi | |
| 5,976,713 A * | 11/1999 | Fuke et al. | 428/811 |
| 6,114,719 A | 9/2000 | Dill et al. | |
| 6,307,708 B1 | 10/2001 | Yoda et al. | |
| 2001/0026471 A1 | 10/2001 | Michijima et al. | |
| 2002/0154455 A1 | 10/2002 | Lenssen | |

FOREIGN PATENT DOCUMENTS

| | | |
|---|---|---|
| EP | 0 755 086 A2 | 1/1997 |
| EP | 0 982 736 A2 | 3/2000 |
| JP | 2001/156357 A | 6/2001 |
| JP | 2001/156358 A | 6/2001 |

(Continued)

OTHER PUBLICATIONS

Parkin, S.S. et al., "*Exchange-Biased Magnetic Tunnel Junctions and Application to Nonvolatile Magnetic Random Access*", Journal of Applied Physics, vol. 85, No. 8, Apr. 15, 1999, pp. 5828-5833, IBM Research Division, Almaden Research Center, San Jose, California 95120.

(Continued)

*Primary Examiner*—Douglas M. Menz
(74) *Attorney, Agent, or Firm*—Edell, Shapiro & Finnan, LLC

(57) ABSTRACT

A digital magnetic memory cell device for read and/or write operation includes a soft-magnetic read and/or write layer system and at least one hard-magnetic reference layer system formed as an AAF system. The AAF system includes an AAF layer composite and at least one reference layer. The reference layer system includes at least one ferromagnetic layer arranged adjacent to a magnetic layer of the AAF layer composite in which the thickness of the antiferromagnetic layer is dimensioned to have a uniaxial anisotropy.

14 Claims, 1 Drawing Sheet

FOREIGN PATENT DOCUMENTS

| | | | |
|---|---|---|---|
| JP | 2002/208680 | A | 7/2002 |
| JP | 2002/289947 | | 10/2002 |
| JP | 2002/353417 | A | 12/2002 |

OTHER PUBLICATIONS

Marrows, C.H., "*Canted Exchange Bias in Antiparallel Biased Spin Valves*", Journal of Applied Physics, vol. 87, No. 9, May 1, 2000, pp. 5058-5060, Dept. of Physics and Astronony, E.C. Stoner Laboratory, University of Leeds, Leeds LS29JT United Kingdom.

Oliveira et al., "*Improvement of Thermal Stability and Magnetoresistance Recovery of TB25Co75 Baised Spin-Valve Heads*", Journal of Applied Physics, vol. 81, No. 8, Apr. 15, 1997, pp. 4903-4905, INESC, R. Alves Redel 9-1, 1000 Lisboa, Portugal.

Berkov et al., "*Numerical Stimulations of Remagnetization Processes in Sub-µm Multilayer Magnetic Structures*", Tagungsband Statusseminar, Dresden, 2000, pp. 95-99, Innovent e. V., Felsbachstr. 5, D-07745 Jena, Germany.

\* cited by examiner

DIGITAL MAGNETIC STORAGE CELL DEVICE

FIELD OF THE INVENTION

The invention relates to a digital magnetic memory cell device for read and/or write operations.

BACKGROUND

A digital memory cell device of this type can magnetically store. An individual memory cell device is generally part of a memory device, often also called an MRAM (magnetic random access memory). A memory of this type can be used to carry out read and/or write operations. Each individual memory cell device comprises a soft-magnetic read and/or write layer system, which is separated by an intermediate layer from a hard-magnetic reference layer system formed as an AAF system. The magnetization of the reference layer of the reference layer system is stable and does not change in an applied field, while the magnetization of the soft-magnetic read and/or write layer system can be switched by an applied field. The two magnetic layer systems can be magnetized parallel or antiparallel with respect to one another. The two aforementioned states in each case represent a bit of information, i.e., the logic zero ("0") state or one ("1") state. If the relative orientation of the magnetization of the two layers changes from parallel to antiparallel, or vice versa, then the magnetoresistance across this layer structure changes by a few percent. This change in resistance can be used for the read-out of digital information stored in the memory cell. The change in the cell resistance can be identified by a voltage change. By way of example, the cell may be occupied by a logic zero ("0") in the event of a voltage increase and the cell may be occupied by a logic one ("1") in the event of a voltage decrease. Particularly large resistance changes in the region of a few percent have been observed when the magnetization orientation changes from parallel to antiparallel and vice versa in cell structures of the GMR type (giant magnetoresistance) or the TMR type (tunnel magnetoresistance).

An important advantage of such magnetic memory cells is that the information is stored in a persistent manner, and is stored without maintenance of any basic supply even with the device switched off and is immediately available again after the device is switched on, unlike in known conventional semiconductor memories.

A central component is the reference layer system formed as an AAF system (AAF=artificial antiferromagnetic). Such an AAF system is advantageous on account of its high magnetic rigidity and the relatively low coupling to the read and/or write layer system through the so-called orange peel effect and/or through macroscopic magnetostatic coupling fields. An AAF system generally comprises a first magnetic layer or a magnetic layer system, an antiferromagnetic coupling layer and a second magnetic layer or a magnetic layer system which is coupled by its magnetization, via the antiferromagnetic coupling layer, oppositely to the magnetization of the lower magnetic layer. Such an AAF system can be formed, e.g., from two magnetic Co layers and an antiferromagnetic coupling layer made of Cu.

In order to improve the rigidity of the AAF system, that is to say its resistance to external outer fields, it is customary to arrange an antiferromagnetic layer at the magnetic layer of the AAF system which is remote from the read and/or write layer system. By means of this antiferromagnetic layer, the directly adjacent magnetic layer is additionally pinned in its magnetization, so that overall the AAF system becomes harder (exchange pinning or exchange biasing).

The magnetic rigidity of the AAF system corresponds to the amplitude of the applied external fields, which is required for rotating the magnetizations of the two ferromagnetic layers in the same direction, i.e., for parallel setting. This limits the magnetic window for read and write applications of such a memory cell device.

SUMMARY

The invention is based on the problem of specifying a memory cell device which has a larger magnetic window or operation window.

In order to solve this problem, in the case of a memory cell device as described above the thickness of the antiferromagnetic layer is dimensioned in such a way that it has a uniaxial anisotropy.

In known memory cell devices, the antiferromagnetic layer, which pins the magnetization of the ferromagnetic layers situated above it by exchange biasing, has a considerable thickness, which results in a unidirectional anisotropy. However, a unidirectional anisotropy leads to asymmetrical hysteresis curves which, for their part, in turn lead to narrower magnetic windows or operation windows.

The invention is based on the insight that a symmetrical hysteresis curve can be achieved when the antiferro-magnetic layer is so thin that it has a uniaxial anisotropy. This makes it possible to significantly widen the magnetic window with the use of the same materials for forming the memory cell device. Furthermore, the thermal stability of the device is increased, since the blocking temperature, i.e., the temperature above which the anisotropy of the antiferromagnetic layer is lost, increases, which is advantageous with regard to the thermal stability of the entire system.

In this case, the antiferromagnetic layer is arranged at that side of the AAF layer composite which is remote from the read and/or write layer system. The thickness of the antiferromagnetic layer is selected dependent on the layer material used and is less than 10 nm. The antiferromagnetic layer may comprise any desired material used in known fashion to construct such memory cell devices, e.g., NiO, FeMn, IrMn, NiMn, PtMn, CrPtMn, RhMn, or PdMn.

In this case, it is expedient if the antiferromagnetic layer is arranged at that side of the AAF layer composite which is remote from the read and/or write layer system. The thickness of the antiferromagnetic layer is expediently chosen in a manner dependent on the layer material used and is always $\leq 10$ nm. The antiferromagnetic layer may comprise any desired material used in known fashion to construct such memory cell devices, e.g. NiO, FeMn, IrMn, NiMn, PtMn, CrPtMn, RhMn or PdMn.

The memory cell device itself may be a giant magnetoresistive, a magnetic tunnel junction or a spin valve transistor device.

In addition to the memory cell device itself, the invention furthermore relates to a digital memory device comprising a plurality of memory cell devices of the type described.

BRIEF DESCRIPTION OF THE FIGURES

Further advantages, features and details of the invention emerge from the exemplary embodiment described below and also with reference to the drawings, in which.

DETAILED DESCRIPTION

Figure 1:
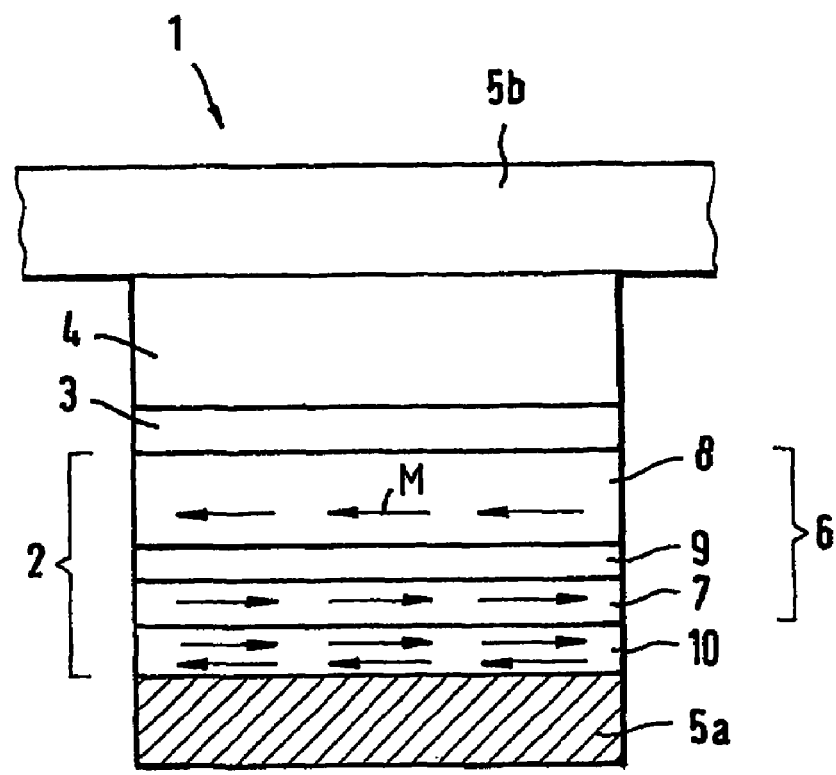
FIG. 1 shows a basic diagrammatic sketch of a memory cell device according to the invention.

FIG. 1 shows a memory cell device 1 according to the invention in a first embodiment. This comprises a reference layer system 2, which is decoupled from a soft-magnetic read and/or write layer system 4 via a decoupling layer 3. The illustration furthermore shows the word and bit lines 5a, 5b running above and below at right angles to one another. The reference layer system 2 itself is arranged on a substrate 5. The reference layer system 2 comprises an AAF layer composite 6, comprising a lower ferromagnetic layer 7, an upper ferromagnetic layer 8 and a coupling layer 9 which is arranged between the layers and couples in antiparallel fashion. The ferromagnetic layers may be made, e.g., of Co and the coupling layers, which couples in antiparallel fashions, may be made of Cu. The construction of such an AAF layer composite is known.

The reference layer system 2 furthermore comprises an antiferromagnetic layer 10, which is provided below the lower ferromagnetic layer 7, and may be made, e.g., of NiO, FeMn, IrMn, NiMn, PtMn, CrPtMn, RhMn, or PdMn. The antiferromagnetic layer 10 couples the magnetization of the lower ferromagnetic layer 7 situated above it, i.e., the latter is oriented parallel to the magnetic moments of the antiferromagnetic layer in the interface region. As a result of this, the magnetization of the ferromagnetic layer 7 is pinned by exchanged biasing.

The thickness of the antiferromagnetic layer 10 is now dimensioned in such a way, or the layer is deposited so thin, that it has only a uniaxial anisotropy. The layer thicknesses are significantly smaller than the typical thickness values for antiferromagnetic coupling layers which couple through exchange biasing. By way of example, in the case of an antiferromagnetic layer made of IrMn, the customary layer thickness is approximately 8–10 nm. With such a thick layer, however, a unidirectional anisotropy is established, which adversely affects the width of the magnetic window or the hysteresis curve, and the thermal stability of the memory cell device.

Figure 2:
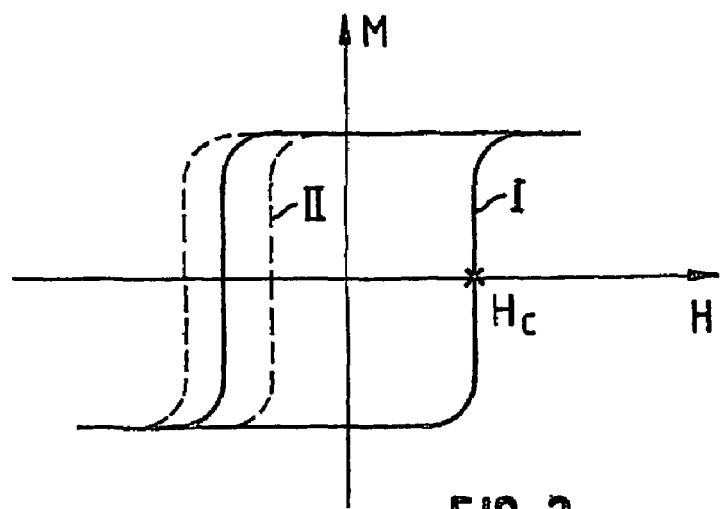
FIG. 2 shows a diagram for illustrating the hysteresis curves resulting in the case of a uniaxial and a unidirectional anisotropy.

The layer thickness of the antiferromagnetic layer 10 is significantly smaller, for example, the layer made of IrMn is, e.g., merely 2–3 nm. This has the effect that a uniaxial rather than a unidirectional, anisotropy is established. This makes it possible, as shown clearly by FIG. 2, to obtain a symmetrical hysteresis curve, which exhibits a significantly wider magnetic window. In Figure, the solid curve I shows the profile of the external fields, which is applied to the memory cell device, in order to rotate the magnetizations, in the case of a very thin antiferro-magnetic layer 10 having only a uniaxial anisotropy. The curve I is symmetrical and the magnetic window is considerably wide. By contrast, the dashed curve II shows an example of the profile of the magnetization curve in the case of a unidirectional anisotropy. The curve is clearly asymmetrical and the magnetic window is significantly narrower.

In addition to an improvement with regard to widening of the magnetic window, the use of a very thin anti-ferromagnetic layer 10 is also advantageous to the effect of increasing the thermal stability of the device. The blocking temperature, i.e., the temperature above which the anisotropy of the layer is lost, of an antiferromagnetic layer made of IrMn can be increased from approximately 250° C. in the case of relatively thick layers within the above-specified larger thickness range to as much as approximately 400° C. in the case of significantly thinner layers.

A number of implementations have been described. Nevertheless, it will be understood that various modifications may be made without departing from the spirit and scope. Accordingly, other embodiments are within the scope of the following claims.

| List of reference symbols | |
|---|---|
| 1 | Memory cell device |
| 2 | Reference layer system |
| 3 | Decoupling layer |
| 4 | Read and/or write layer system |
| 5a | Word and bit lines |
| 5b | Word and bit lines |
| 6 | AAF layer composite |
| 7 | Lower ferromagnetic layer |
| 8 | Upper ferromagnetic layer |
| 9 | Coupling layer |
| 10 | Antiferromagnetic layer |

The invention claimed is:

1. A digital magnetic memory cell device for read and/or write operations, comprising:
    a soft-magnetic read and/or write layer system; and
    at least one hard-magnetic reference layer system formed as an AAF system, the AAF system including an AAF layer composite and at least one reference layer, the reference layer system including at least one antiferromagnetic layer arranged adjacent to a magnetic layer of the AAF layer composite, wherein a thickness of the antiferromagnetic layer is dimensioned in such a way that the antiferromagnetic layer has a uniaxial anisotropy.

2. The digital magnetic cell device according to claim 1, wherein the antiferromagnetic layer is arranged at a side of the AAF layer composite remote from the read and/or write layer system.

3. The digital magnetic cell device according to claim 1, wherein the thickness of the antiferro-magnetic layer relates to the layer material used and is less than 10 nm.

4. The digital magnetic cell device according to claim 1, wherein the antiferro-magnetic layer is a material from the group NiO, FeMn, IrMn, NiMn, PtMn, CrPtMn, RhMn, and PdMn.

5. The digital magnetic cell device according to claim 1, wherein the digital magnetic memory cell device is a giant magnetoresistive, a magnetic tunnel junction, or a spin valve transistor system.

6. A digital memory device, comprising:
    a plurality of digital magnetic memory cell devices, each digital magnetic memory cell device including a digital magnetic memory cell device for read and/or write operations having a soft-magnetic read and/or write layer system, and at least one hard-magnetic reference layer system formed as an AAF system, the AAF system including an AAF layer composite and at least one reference layer, the reference layer system including at least one antiferromagnetic layer arranged adjacent to a magnetic layer of the AAF layer composite, wherein a thickness of the antiferromagnetic layer is dimensioned in such a way that the antiferromagnetic layer has a uniaxial anisotropy.

7. The digital magnetic cell device according to claim 2, wherein the thickness of the antiferro-magnetic layer relates to the layer material used and is less than 10 nm.

8. The digital magnetic cell device according to claim 2, the antiferro-magnetic layer is a material from the group NiO, FeMn, IrMn, NiMn, PtMn, CrPtMn, RhMn and PdMn.

9. The digital magnetic cell device according to claim 6, wherein the antiferromagnetic layer is arranged at a side of the AAF layer composite remote from the read and/or write layer system.

10. The digital magnetic cell device according to claim 6, wherein the thickness of the antiferro-magnetic layer relates to the layer material used and is less than 10 nm.

11. The digital magnetic cell device according to claim 9, wherein the thickness of the antiferro-magnetic layer relates to the layer material used and is less than 10 nm.

12. The digital magnetic cell device according to claim 6, the antiferro-magnetic layer is a material from the group NiO, FeMn, IrMn, NiMn, PtMn, CrPtMn, RhMn, and PdMn.

13. The digital magnetic cell device according to claim 9, the antiferro-magnetic layer is a material from the group NiO, FeMn, IrMn, NiMn, PtMn, CrPtMn, RhMn and PdMn.

14. The digital magnetic cell device according to claim 6, wherein the digital magnetic memory cell device is a giant magnetoresistive, a magnetic tunnel junction, or a spin valve transistor system.

* * * * *

UNITED STATES PATENT AND TRADEMARK OFFICE
CERTIFICATE OF CORRECTION

PATENT NO. : 7,230,290 B2
APPLICATION NO. : 10/479521
DATED : June 12, 2007
INVENTOR(S) : Hans Boeve et al.

Page 1 of 1

It is certified that error appears in the above-identified patent and that said Letters Patent is hereby corrected as shown below:

Col. 2, line 4: "fields," should read --field,--

Col. 2, line 44-52: Delete paragraph ("In this case, it is expedient...")

Col. 3, line 50: "Figure," should read --Figure 2,--

Col. 3, line 51: "fields," should read --field,--

Signed and Sealed this

Twenty-ninth Day of April, 2008

JON W. DUDAS
*Director of the United States Patent and Trademark Office*